United States Patent
Choi

(10) Patent No.: US 6,939,773 B2
(45) Date of Patent: Sep. 6, 2005

(54) SEMICONDUCTOR DEVICES AND MANUFACTURING METHODS THEREOF

(75) Inventor: Yong Keon Choi, Bucheon (KR)

(73) Assignee: DongbuAnam Semiconductor, Inc., Seoul (KR)

(*) Notice: Subject to any disclaimer, the term of this patent is extended or adjusted under 35 U.S.C. 154(b) by 0 days.

(21) Appl. No.: 11/023,073

(22) Filed: Dec. 27, 2004

(65) Prior Publication Data

US 2005/0142789 A1 Jun. 30, 2005

(30) Foreign Application Priority Data

Dec. 27, 2003 (KR) .................... 10-2003-0098331

(51) Int. Cl.$^7$ ............................................. H01L 21/331
(52) U.S. Cl. .................... 438/357; 438/360; 438/369; 438/478; 438/524
(58) Field of Search ................ 438/357, 360, 438/369, 476, 524

(56) References Cited

U.S. PATENT DOCUMENTS 4,887,144 A * 12/1989 Cook et al. ................ 257/513
5,057,443 A * 10/1991 Hutter ........................ 438/330
5,250,837 A * 10/1993 Sparks ....................... 257/519
6,329,265 B1 * 12/2001 Miyawaki et al. .......... 438/401
6,790,713 B1 * 9/2004 Horch ........................ 438/135

* cited by examiner

*Primary Examiner*—Trung Dang
(74) *Attorney, Agent, or Firm*—Hanley, Flight & Zimmerman, LLC

(57) ABSTRACT

Semiconductor device fabrication methods include forming an oxide layer on a semiconductor substrate, forming an arrangement trench on the semiconductor substrate by patterning the oxide layer and the semiconductor substrate, forming a nitride layer on the arrangement trench and the oxide layer, forming a field trench on the semiconductor substrate by patterning the nitride layer, oxide layer, and the semiconductor substrate, and forming a pad oxide layer on inner walls of the field trench. The methods may also include removing the pad oxide layer on a bottom wall of the field trench, injecting ions into the bottom wall of the field trench so as to form an ion injected region, forming a buried layer by diffusing the ion injected region, and forming an epitaxial layer on the buried layer.

12 Claims, 5 Drawing Sheets

Prior Art

SEMICONDUCTOR DEVICES AND MANUFACTURING METHODS THEREOF

TECHNICAL FIELD

The present disclosure relates to semiconductor devices and, more particularly, to semiconductor devices and manufacturing methods thereof.

BACKGROUND

A conventional bipolar transistor includes device isolation regions formed on a semiconductor substrate at a predetermined depth using high impurity concentration of a conductive type identical with that of the semiconductor substrate. The conventional bipolar transistor also includes a buried layer formed between the device isolation regions at a depth deeper than that of the device isolation regions and having a conductive type opposite to that of the semiconductor substrate. Additionally, such devices typically include an epitaxial layer formed on the buried layer and having the conductive type opposite to that of the semiconductor substrate.

The conventional transistor includes a base region formed in the device region in predetermined depth and size, an emitter region formed within the base region at a predetermined depth, and a collector region formed within the epitaxial layer in predetermined depth and size at a predetermined distance from the base region.

Also, the conventional bipolar transistor includes an upper dielectric layer formed over the device isolation region, the device region, the base region, and the emitter and collector regions, and having contact holes for connecting the base, emitter, and collector regions to outside, and a metal wiring layer formed from upper surfaces of the regions to the dielectric layer through the contact hole.

The height difference between the epitaxial layer and the semiconductor substrate of the bipolar transistor is typically used as an arrangement key for subsequent processing after the epitaxial layer is formed.

However, in case of using P+ type semiconductor substrate, a P+ type epitaxial layer rises above the N+ type buried layer being slanted at a 45 degree angle such that the position of the arrangement key becomes inconsistent with the buried layer.

DETAILED DESCRIPTION

Figure 1:
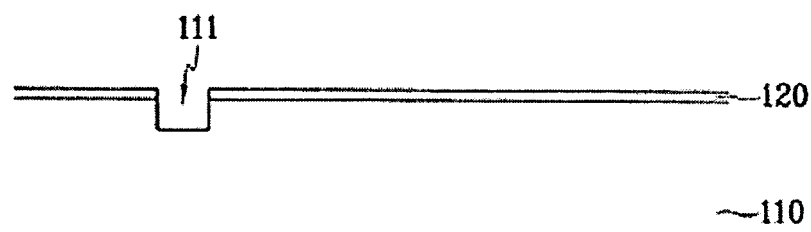
FIGS. 1 to 8 are cross-sectional views illustrating a semiconductor device at various stages of a first disclosed semiconductor fabrication process.

The following disclosure sets forth example methods of forming buried layer of a bipolar transistor. To clarify multiple layers and regions, the thickness of the layers in the attached drawings are enlarged. Wherever possible, the same reference numbers will be used throughout the drawing(s) to refer to the same or like parts. When it is said any part such as a layer, film, area, or plate is positioned on another part, it means the part is right on the other part, or above the other part with at least one intermediate part. Additionally, a statement that any part is positioned right on other part means that there is no intermediate part between the two parts.

As shown in FIG. 1, according to a first example disclosed semiconductor fabrication, an oxide layer 120 is formed on a N+ type silicon substrate 110 at a thickness of approximately 200 Å.

Next, a protection nitride layer is formed over the oxide layer 120 and the semiconductor substrate 110 and then the protection nitride layer is removed except for that on the semiconductor substrate 110. The protection nitride layer is formed for preventing the ions to be doped on the semiconductor at a following process from leaking outside through the surface of the semiconductor substrate 110.

Next, an arrangement trench 111 is formed on the semiconductor substrate 110 by patterning the oxide layer 120 and the semiconductor substrate 110. Such arrangement trench 111 is formed by depositing an arrangement photoresist pattern on the oxide layer 120 and patterning the oxide layer 120 and the semiconductor substrate 110 using the arrangement photoresist pattern as an etch protection layer. In one example, the arrangement trench 111 is formed at a depth in the range of 0.1 to 0.3 micrometers ($\mu$m). This arrangement trench 111 acts as the arrangement key for following processes. After patterning process, the arrangement pattern is removed.

Figure 2:
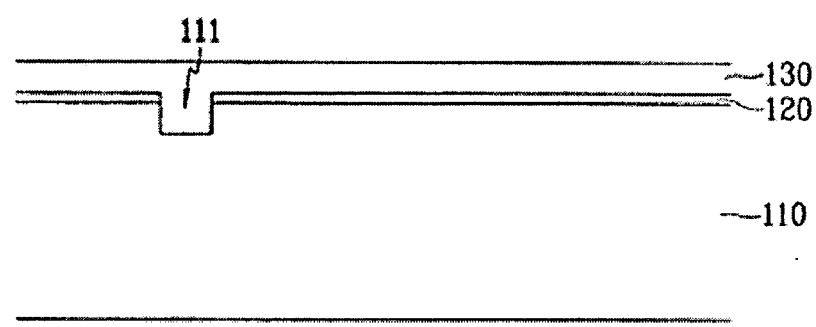

Next, as shown in FIG. 2, a nitride layer 130 is formed on the arrangement trench 111 and the oxide layer 120. The nitride layer 130 is preferably formed at the thickness of 2000 Å.

Figure 3:
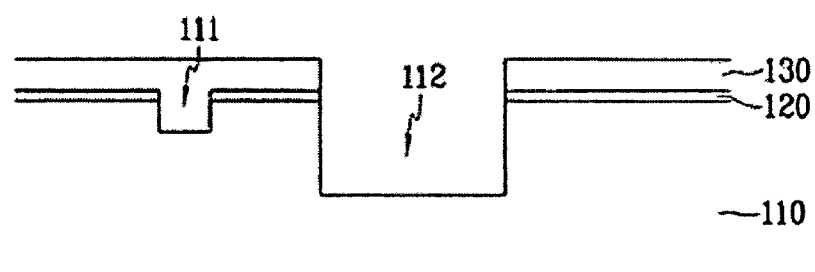

Sequentially, as shown in FIG. 3, a field trench 112 is formed on the semiconductor substrate 110 by patterning the nitride layer 130, the oxide layer 120, and the semiconductor substrate 110. The field trench 112 is formed by depositing the field photoresist pattern on the nitride layer 130 and patterning the nitride layer 130, the oxide layer 120, and the semiconductor substrate 110 using the field photoresist pattern as the etch protection layer. The field trench 112 maybe formed at a depth from about 3 to 10 $\mu$m. The field trench 112 is filled by developing an epitaxial layer so as to be formed as a device formation region at a following process. After the field trench 112 is formed, the field photoresist pattern is removed.

Figure 4:
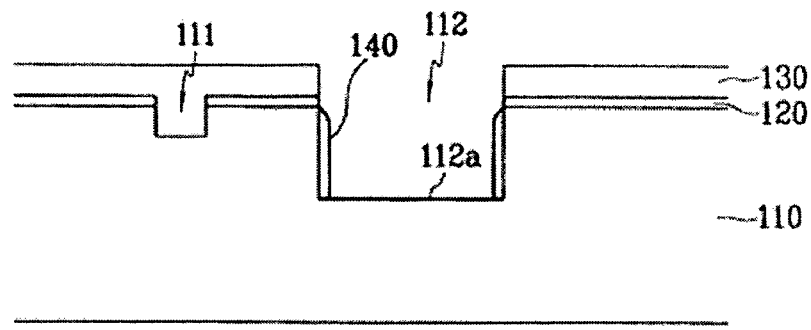

Next, as shown in FIG. 4, a pad oxide layer 140 is formed on the field trench 112. In one example, the pad oxide layer 140 is formed at a thickness of about 450 to 550 Å. The pad oxide layer 140 is formed to prevent ions from being injected into both sidewalls of the field trench 112.

Figure 5:
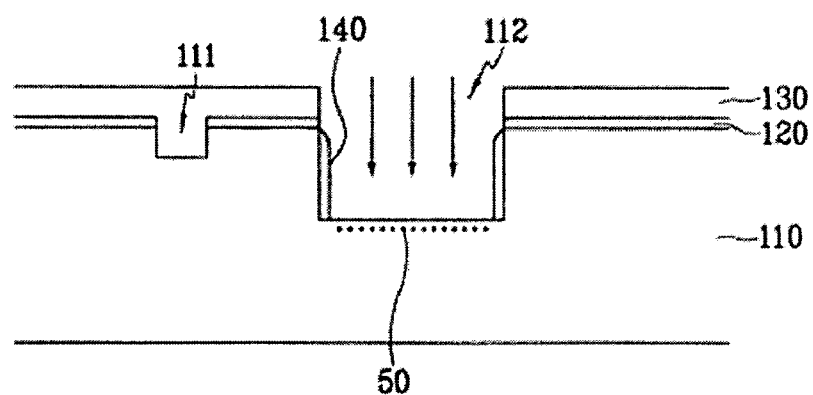

Next, as shown in FIG. 5, the bottom surface of the field trench 112 is exposed by removing the pad oxide layer 140 on the bottom surface of the field trench 112. Ions are then injected on the bottom surface 112a of the exposed field trench 112. According to one particular example, the ion is stibium (Sb).

Figure 6:
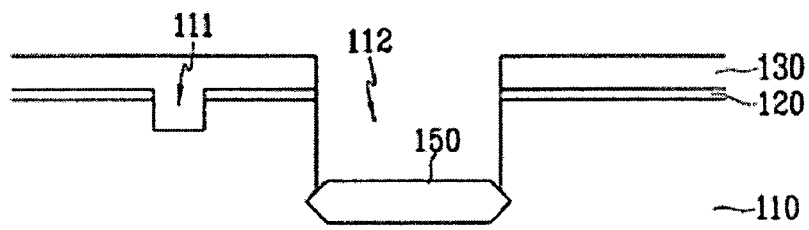

Next, as shown in FIG. 6, a buried layer 150 is formed by diffusing the ion injected region at a thickness of 1950 to 2050 Å. The semiconductor substrate 110 may be formed by P+ type semiconductor and the buried layer may be formed by N+ type semiconductor.

Figure 7:
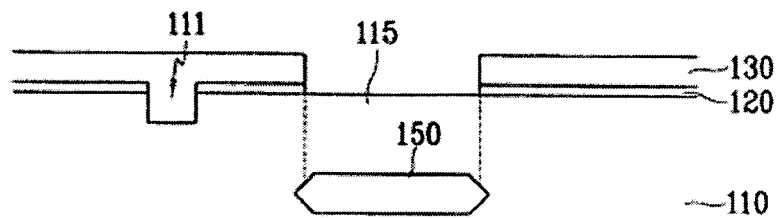

Next, as shown in FIG. 7, an epitaxial layer 115 is developed on the buried layer 150. In this case, the epitaxial layer 115 is not developed on the arrangement trench 111 due to the nitride layer 130 and the oxide layer 120 formed on the arrangement trench 111. Accordingly, the position of the arrangement trench 111 does not change.

Figure 8:
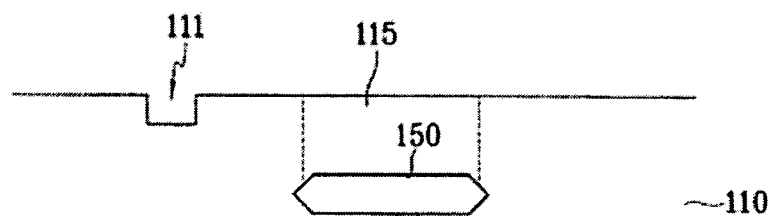

Next, as shown in FIG. 8, the arrangement trench 111 is exposed by removing the nitride layer 130 and the oxide layer 120. In the conventional methods, the N+ or P+ type buried layer 150, which is used in the high energy process, causes the arrangement key to move after the development of the epitaxial layer 115.

Figure 9:
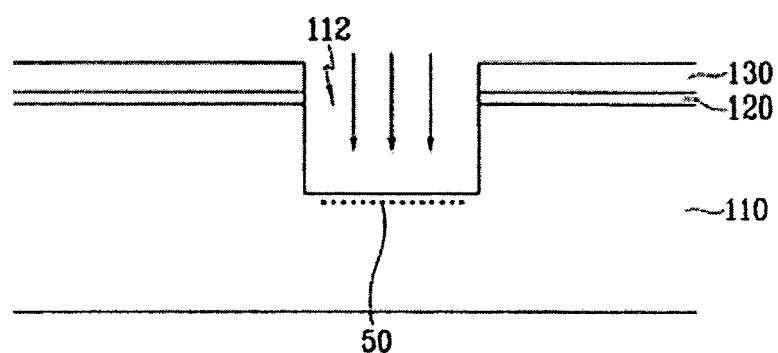
FIGS. 9 to 11 are cross-sectional views illustrating a semiconductor device at various stages of a known semiconductor fabrication process.
Figure 10:
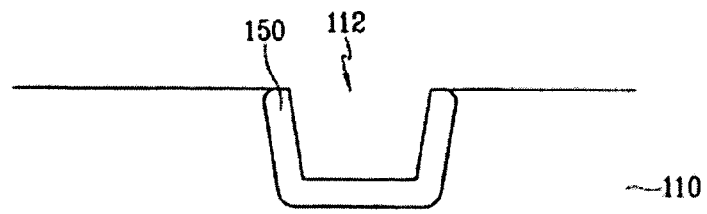
Figure 11:
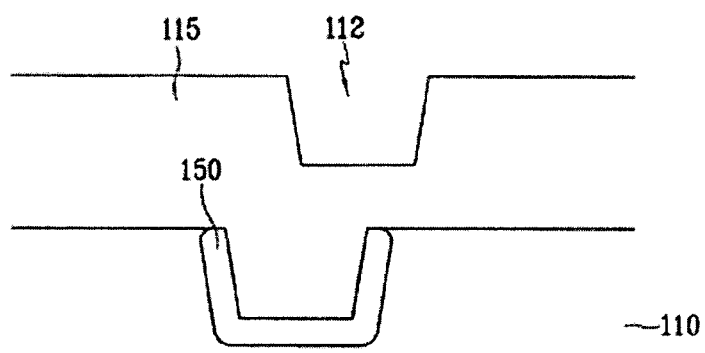

FIG. 9 to FIG. 11 are cross-sectional views illustrating fabricating steps of a conventional semiconductor device.

As shown in FIG. 9, in the conventional semiconductor fabrication method, an oxide layer 120 is formed on a semiconductor substrate 110, i.e., a N+ type silicon substrate, and then the oxide layer 120 and the semiconductor substrate 110 are patterned so as to form a field trench 112 on the semiconductor substrate 110. The field trench 112 is formed by depositing a field photoresist pattern and then patterning the oxide layer 120 and the semiconductor substrate 110 using the field photoresist pattern as an etch protection layer. After the field trench 112 is formed, ions 50 are injected onto the exposed field trench 112. Preferably, the ion is stibium (Sb).

Next, as shown in FIG. 10, according to a known process, a buried layer 150 is formed by diffusing the ion injected region and then the field photoresist pattern is removed.

Next, as shown in FIG. 11, an epitaxial layer 115 is formed on the buried layer 150. In this case, the semiconductor substrate 110 is P(111) type such that the epitaxial layer 115 is developed at an angle of approximate 45 degree relative to a direction of the semiconductor substrate crystal. Accordingly, the position of the field trench 112 is not consistent with the position of the buried layer 150 in vertical direction, thereby the change of the field trench position causes problems in following processes.

However, as disclosed herein the epitaxial layer is not formed on the arrangement trench 111, such that the arrangement key is not changed. Accordingly, problems associated with the conventional method are alleviated.

FIGS. 12 to 15 are cross-sectional views illustrating fabricating steps of the semiconductor device according to a disclosed second example. Here, the same reference numbers will be used throughout the drawing(s) to refer to the same or like parts.

Until the field trench formation process, the second example is identical with the first example, such that only the processes following the field trench formation process will be described with reference to FIG. 12 to FIG. 15.

Figure 12:
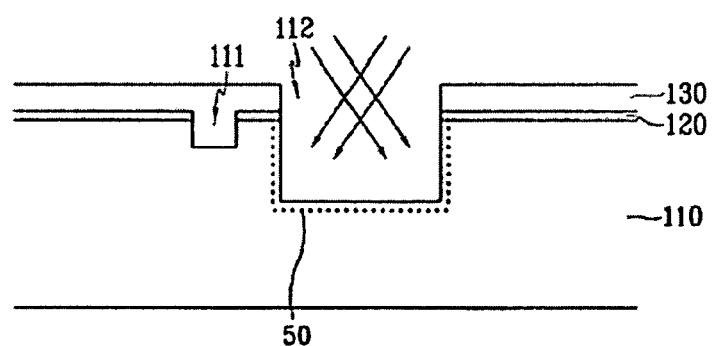
FIGS. 12 to 15 are cross-sectional views illustrating a semiconductor device at various stages of a second disclosed semiconductor fabrication process.

As shown in FIG. 12, the stibium ion 50 is injected within the field trench 112. That is, the stibium ion 50, for example, is injected onto the bottom and side walls of the field trench 112. For this purpose, an ion injection equipment is slanted at an angle in the range of about 20 to 30 degree and then panning as much as 90 degree while injecting the stibium ion 20 onto the field trench 112.

Figure 13:
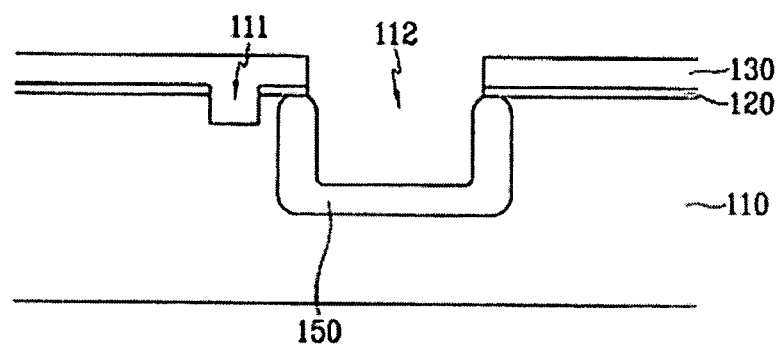

Next, as shown in FIG. 13, the ion injected region is diffused such that the buried layer 150 is formed on the sidewalls of the field trench 112.

Figure 14:
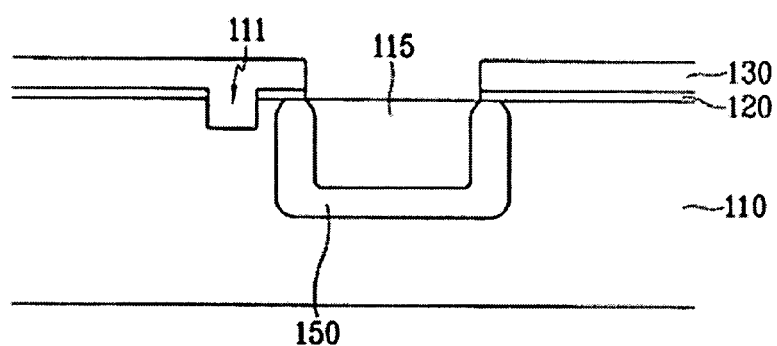
Figure 15:
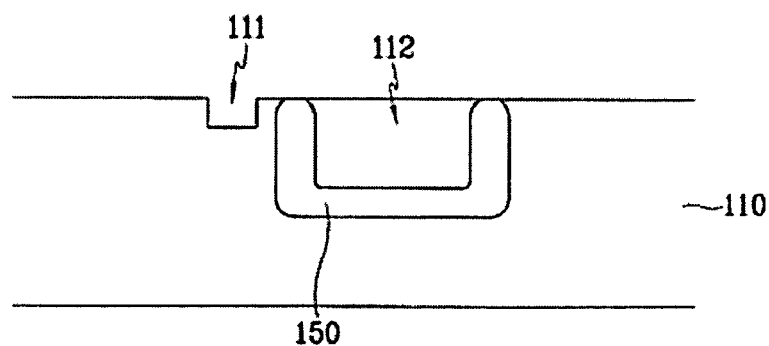

Next, as shown in FIG. 14, the epitaxial layer 115 is formed on the buried layer 150. FIG. 15 shows the remaining semiconductor device after removal of the layers 120 and 130.

The present disclosure provides example methods and techniques to fabricate a semiconductor device by which the position of the arrangement key is not changed.

According to one example, a method for fabricating a semiconductor device includes forming an oxide layer on a semiconductor substrate, forming an arrangement trench on the semiconductor substrate by patterning the oxide layer and the semiconductor substrate, forming a nitride layer on the arrangement trench and the oxide layer, forming a field trench on the semiconductor substrate by patterning the nitride layer, oxide layer, and the semiconductor substrate, forming a pad oxide layer on inner walls of the field trench, removing the pad oxide layer on a bottom wall of the field trench, injecting ions into the bottom wall of the field trench so as to form an ion injected region, forming a buried layer by diffusing the ion injected region, and forming an epitaxial layer on the buried layer.

In one example, the formation of the arrangement trench may include forming an arrangement photoresist pattern on the oxide layer and etching the oxide layer and the semiconductor substrate using the arrangement photoresist pattern as an etch protection layer.

The formation of the field trench may include forming the field trench includes forming a field photoresist pattern on the nitride layer and etching the nitride layer, the oxide layer, and the semiconductor substrate using the field photoresist pattern as an etch protection layer.

The nitride layer and the oxide layer may be removed after an epitaxial layer is formed on the buried layer. The ion that is injected may be stibium (Sb).

According to one example, the arrangement trench may be formed at a depth in the range of about 0.1 to 0.3 µm. Additionally, the field trench may be formed at a depth of trench is formed at a depth in the range of about 3 to 10 µm. The pad oxide layer may be formed at a thickness in the range of about 450 to 550 Å.

The semiconductor substrate may be P+ type and the buried layer may be N+ type. The buried layer may be formed at a thickness in the range of about 1950 to 2050 Å.

In another example, the method may also include forming a protection nitride layer on surfaces of the oxide layer and the semiconductor substrate after the oxide layer is formed on the semiconductor substrate and removing the protection layer formed on the oxide layer.

According to a further example, the method may include forming an oxide layer on the semiconductor substrate, forming an arrangement trench on the semiconductor substrate by patterning the oxide layer and the semiconductor substrate, forming a nitride layer on the arrangement trench and the oxide layer, forming a field trench on the semiconductor substrate by patterning the nitride layer, the oxide layer, and the semiconductor substrate, injecting ions on inner walls of the field trench so as to form an ion injected region, forming a buried layer by diffusing the ion injected region, and forming an epitaxial layer on the buried layer.

As described above, in the semiconductor device fabrication method, the arrangement trench on which the epitaxial layer is not developed so as to avoid the change of the arrangement key.

This application makes reference to, incorporates the same herein, and claims all benefits accruing under 35 U.S.C. § 119 from an application for SEMICONDUCTOR DEVICE AND MANUFACTURING METHOD THEREOF filed in the Korean Industrial Property Office on Dec. 27, 2003, and there duly assigned Serial No. 10-2003-0098331.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a semiconductor device, comprising:
   forming an oxide layer on a semiconductor substrate;
   forming an arrangement trench on the semiconductor substrate by patterning the oxide layer and the semiconductor substrate;
   forming a nitride layer on the arrangement trench and the oxide layer;
   forming a field trench on the semiconductor substrate by patterning the nitride layer, oxide layer, and the semiconductor substrate;
   forming a pad oxide layer on inner walls of the field trench;
   removing the pad oxide layer on a bottom wall of the field trench;
   injecting ions into the bottom wall of the field trench so as to form an ion injected region;
   forming a buried layer by diffusing the ion injected region; and
   forming an epitaxial layer on the buried layer.

2. A method as defined by claim 1, wherein forming the arrangement trench includes:
   forming an arrangement photoresist pattern on the oxide layer; and
   etching the oxide layer and the semiconductor substrate using the arrangement photoresist pattern as an etch protection layer.

3. A method as defined by claim 1, wherein forming the field trench includes:
   forming a field photoresist pattern on the nitride layer; and
   etching the nitride layer, the oxide layer, and the semiconductor substrate using the field photoresist pattern as an etch protection layer.

4. A method as defined by claim 1, wherein the nitride layer and the oxide layer are removed after an epitaxial layer is formed on the buried layer.

5. A method as defined by claim 1, wherein the ion injected into the bottom wall of the field trench comprises stibium (Sb).

6. A method as defined by claim 1, wherein the arrangement trench is formed at a depth in the range of about 0.1 to 0.3 μm.

7. A method as defined by claim 1, wherein the field trench is formed at a depth in the range of about 3 to 10 μm.

8. A method as defined by claim 1, wherein the pad oxide layer is formed at a thickness in the range of about 450 to 550 Å.

9. A method as defined by claim 1, wherein the semiconductor substrate comprises P+ type and the buried layer comprises N+ type.

10. A method as defined by claim 1, wherein the buried layer is formed at a thickness in the range of about 1950 to 2050 Å.

11. A method as defined by claim 1 further comprising:
    forming a protection nitride layer on surfaces of the oxide layer and the semiconductor substrate after the oxide layer is formed on the semiconductor substrate; and
    removing the protection layer formed on the oxide layer.

12. A method for fabricating a semiconductor, comprising:
    forming an oxide layer on the semiconductor substrate;
    forming an arrangement trench on the semiconductor substrate by patterning the oxide layer and the semiconductor substrate;
    forming a nitride layer on the arrangement trench and the oxide layer;
    forming a field trench on the semiconductor substrate by patterning the nitride layer, the oxide layer, and the semiconductor substrate;
    injecting ions on inner walls of the field trench so as to form an ion injected region;
    forming a buried layer by diffusing the ion injected region; and
    forming an epitaxial layer on the buried layer.

* * * * *